United States Patent
Siddiqui et al.

(10) Patent No.: US 10,510,834 B2
(45) Date of Patent: Dec. 17, 2019

(54) HIGH-VOLTAGE SEMICONDUCTOR DEVICE HAVING A DOPED ISOLATION REGION BETWEEN A LEVEL SHIFT REGION AND A HIGH VOLTAGE REGION

(71) Applicant: Nuvoton Technology Corporation, Hsinchu (TW)

(72) Inventors: Md Imran Siddiqui, Dhanbad (IN); Po-An Chen, Toufen (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 0 days.

(21) Appl. No.: 15/859,042

(22) Filed: Dec. 29, 2017

(65) Prior Publication Data
US 2018/0190767 A1 Jul. 5, 2018

(30) Foreign Application Priority Data

Dec. 30, 2016 (TW) .............................. 105144153 A

(51) Int. Cl.
*H01L 29/06* (2006.01)
*H01L 29/78* (2006.01)
(Continued)

(52) U.S. Cl.
CPC ...... *H01L 29/0646* (2013.01); *H01L 21/2253* (2013.01); *H01L 21/266* (2013.01);
(Continued)

(58) Field of Classification Search
CPC ..... H01L 29/0607–0623; H01L 29/063–0634; H01L 29/0646;
(Continued)

(56) References Cited

U.S. PATENT DOCUMENTS 5,426,325 A 6/1995 Chang et al.
8,592,901 B1 11/2013 Sheu et al.
(Continued)

FOREIGN PATENT DOCUMENTS

CN 101826554 A 9/2010
CN 103268886 B 6/2015
(Continued)

OTHER PUBLICATIONS

Richard C. Jaeger, "Introduction to Microelectronic Fabrication", Addison-Wesley, May 1993, pp. 62-63.*
(Continued)

*Primary Examiner* — Younes Boulghassoul
(74) *Attorney, Agent, or Firm* — Muncy. Geissler, Olds & Lowe, P.C.

(57) ABSTRACT

A semiconductor device is disclosed. The semiconductor device includes a substrate structure including a high side region, a low side region, a level shift region and an isolation region. The low side region is separated from the high side region. The level shift region and the isolation region are disposed between the low side region and the high side region. The level shift region is separated from the high side region by the isolation region. A doped isolation region, which is disposed in the isolation region, includes a first doped portion and a second doped portion adjacent to the first doped portion. The depth of the first doped portion is decreased linearly along a first direction from the isolation region to the level shift region. The depth of the second doped portion is decreased linearly along a second direction from the isolation region to the high side region.

17 Claims, 3 Drawing Sheets

(51) Int. Cl.
  *H01L 29/08* (2006.01)
  *H01L 21/761* (2006.01)
  *H01L 21/225* (2006.01)
  *H01L 21/266* (2006.01)

(52) U.S. Cl.
  CPC ........ *H01L 21/761* (2013.01); *H01L 29/0878* (2013.01); *H01L 29/7817* (2013.01); *H01L 29/7823* (2013.01); *H01L 29/7835* (2013.01)

(58) Field of Classification Search
  CPC ... H01L 29/0657; H01L 29/0684–0696; H01L 29/7811; H01L 29/7823; H01L 29/66681–66704; H01L 29/7816–7826; H01L 29/66712–66734; H01L 29/7802–7815; H01L 29/0615; H01L 29/0688; H01L 21/266; H01L 21/0465; H01L 29/1083; H01L 29/36; H01L 21/761; H01L 29/7835; H01L 29/66659; H01L 29/1095; H01L 29/0878
  See application file for complete search history.

(56) References Cited

U.S. PATENT DOCUMENTS

| | | | |
|---|---|---|---|
| 9,082,841 B1* | 7/2015 | Chang | H01L 29/78 |
| 2003/0193067 A1 | 10/2003 | Kim et al. | |
| 2004/0217377 A1 | 11/2004 | Deboy | |
| 2007/0272979 A1 | 11/2007 | Saito et al. | |
| 2011/0233714 A1 | 9/2011 | Lu | |
| 2012/0086052 A1* | 4/2012 | Chen | H01L 29/0607 257/288 |
| 2012/0126323 A1 | 5/2012 | Wu et al. | |
| 2012/0241861 A1* | 9/2012 | Chen | H01L 29/0634 257/339 |
| 2013/0020680 A1* | 1/2013 | Chen | H01L 29/866 257/603 |
| 2013/0341718 A1* | 12/2013 | Kim | H01L 29/402 257/342 |
| 2014/0027811 A1 | 1/2014 | Chen et al. | |
| 2014/0048880 A1 | 2/2014 | Tsuchiko | |
| 2014/0054656 A1* | 2/2014 | Chen | H01L 21/823481 257/288 |
| 2014/0061788 A1* | 3/2014 | Chen | H01L 29/7816 257/339 |
| 2014/0203406 A1* | 7/2014 | Shi | H01L 21/265 257/544 |
| 2014/0353678 A1 | 12/2014 | Kawakami et al. | |
| 2015/0048449 A1* | 2/2015 | Jeon | H01L 29/7816 257/337 |
| 2015/0221721 A1 | 8/2015 | Kawakami et al. | |
| 2016/0043180 A1* | 2/2016 | Chang | H01L 29/0615 257/112 |
| 2016/0172436 A1* | 6/2016 | Ho | H01L 29/0615 257/77 |
| 2016/0254375 A1* | 9/2016 | Nakamura | H01L 29/404 257/144 |
| 2016/0365410 A1* | 12/2016 | Chang | H01L 29/7816 |
| 2017/0200784 A1 | 7/2017 | Shirakawa et al. | |
| 2017/0365595 A1* | 12/2017 | He | H01L 27/0255 |
| 2018/0033854 A1* | 2/2018 | Kaya | H01L 21/823807 |

FOREIGN PATENT DOCUMENTS

| | | |
|---|---|---|
| CN | 106206425 A | 12/2016 |
| TW | 201225292 A | 6/2012 |
| TW | I467766 B | 1/2015 |
| TW | I527098 B | 3/2016 |

OTHER PUBLICATIONS

Office Action dated May 12, 2017 in corresponding TW Application No. 105144153 (2 pages).
Office Action dated Apr. 25, 2017 in corresponding TW Application No. 105144152 (6 pages).
Taiwan Office Action dated Apr. 25, 2018 issued in corresponding application TW 106146498, with search report, 9 pages.
U.S. Office Action of related U.S. Appl. No. 15/858,792, dated Oct. 5, 2018, 54 pages.

* cited by examiner

HIGH-VOLTAGE SEMICONDUCTOR DEVICE HAVING A DOPED ISOLATION REGION BETWEEN A LEVEL SHIFT REGION AND A HIGH VOLTAGE REGION

CROSS REFERENCE TO RELATED APPLICATIONS

This Application claims priority of Taiwan Patent Application No. 105144153, filed on Dec. 30, 2016, the entirety of which is incorporated by reference herein.

BACKGROUND OF THE INVENTION

Field of the Invention

The present invention relates to a semiconductor device and in particular to a high-voltage semiconductor device.

Description of the Related Art

High-voltage integrated circuit (HVIC) devices have been widely applied in the fields of light emitting diodes (LEDs), display driver integrated circuit devices, power supplies, power management integrated circuit (PMIC) devices, communication devices and power control systems of mobile electronics because of its advantages of cost-effectiveness and easy integration with other processes. However, it is hard to improve the conventional high-voltage integrated circuit because of disadvantages that include the latch-up effect, low punch-through voltage, low switching speed, and large device area.

Thus, a new high-voltage semiconductor device is needed in order to overcome these technical challenges.

BRIEF SUMMARY OF THE INVENTION

Exemplary embodiment of a semiconductor device is provided. The semiconductor device includes a substrate structure including a high side region, a low side region, a level shift region and an isolation region. The low side region is separated from the high side region. The level shift region and the isolation region are disposed between the low side region and the high side region. The level shift region is separated from the high side region by the isolation region. A doped isolation region having a first conductive type is disposed in the isolation region. The doped isolation region includes a first doped portion and a second doped portion adjacent to the first doped portion. The depth of the first doped portion is decreased linearly along a first direction from the isolation region to the level shift region. The depth of the second doped portion is decreased linearly along a second direction from the isolation region to the high side region.

Another exemplary embodiment of a semiconductor device includes a substrate structure. The substrate structure includes a high side region, a low side region, a level shift region and an isolation region. The low side region is separated from the high side region. The level shift region and an isolation region are disposed between the high side region and the low side region, wherein the level shift region and the high side region are separated from each other by the isolation region; and a doped isolation region having a first conductive type and located in the isolation region, wherein a depth of the doped isolation region is decreased linearly from a central region close to the doped isolation region to a peripheral region close to the doped isolation region.

An exemplary embodiment of a semiconductor device includes a substrate structure. The substrate structure includes a high side region, a low side region, a level shift region and an isolation region. The low side region is separated from the high side region. The level shift region and the isolation region are disposed between the high side region and the low side region, wherein the level shift region and the high side region are separated from each other by the isolation region; and a doped isolation region having a first conductive type and located in the isolation region, and the doped isolation region extending from a top surface of the substrate structure to a portion of the substrate structure, wherein a first width of the doped isolation region close to the top surface of the substrate structure is greater than a second width of the doped isolation region close to the bottom surface of the substrate structure in a cross-sectional view.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a semiconductor device which is used for a high-voltage integrated circuit (HVIC) device. The semiconductor device includes a doped isolation region disposed in a substrate in an isolation region. In addition, the isolation region is configured to separate a level-shift region from a high side region of the semiconductor device. At least one of the depth and the dopant concentration of the doped isolation region is decreased linearly from a central region of the doped isolation region to a peripheral region of the doped isolation region. The doped isolation region may help to improve the breakdown voltage (BVD) of the high-voltage integrated circuit. In addition, the isolation region may help to further suppress the lateral punch-through leakage current.

Figure 1:
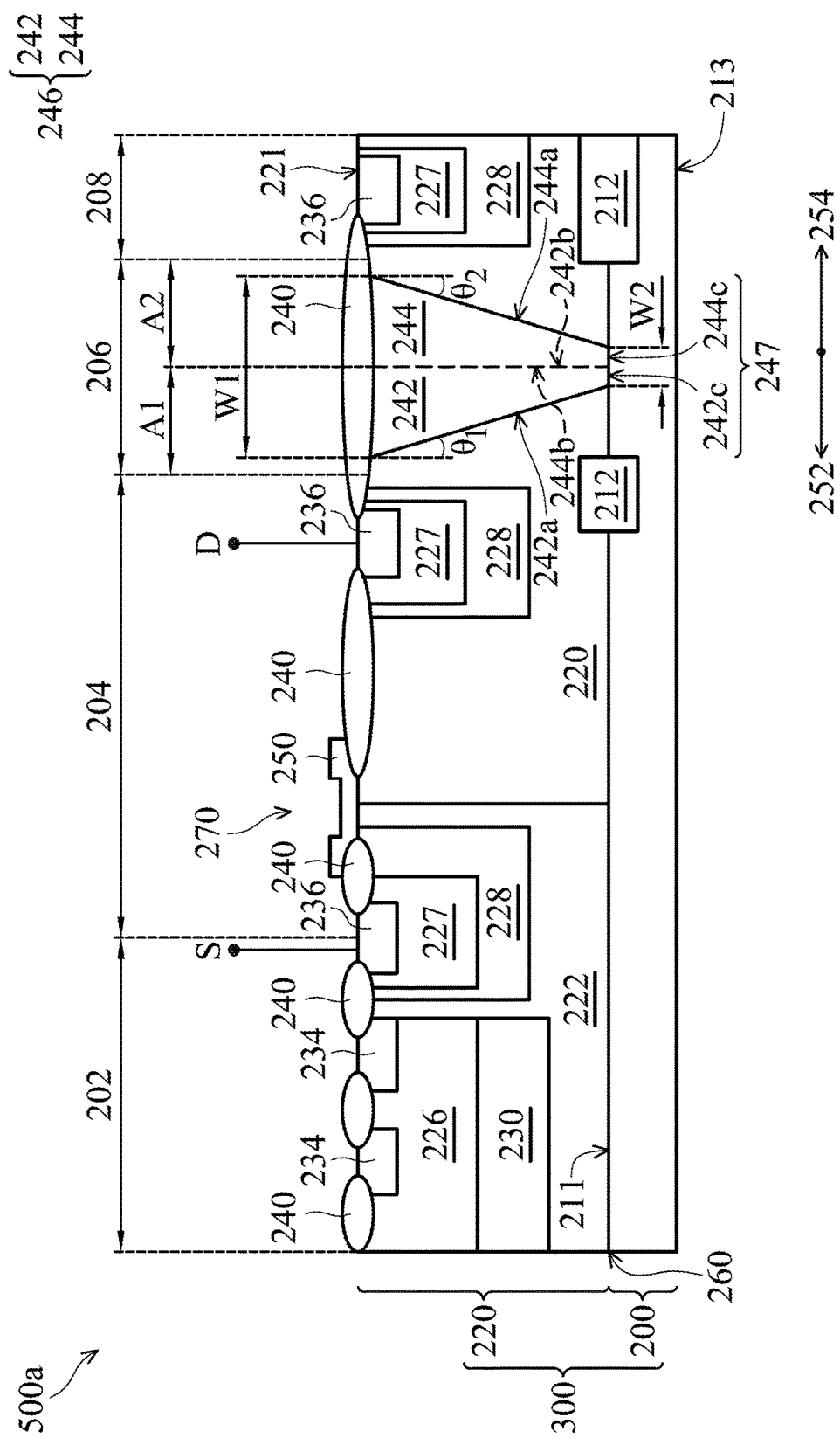
FIGS. 1 and 2 are schematic cross-sectional views showing a semiconductor device in accordance with some embodiments of the disclosure.

FIG. 1 is a schematic cross-sectional view showing a semiconductor device 500a in accordance with some embodiments of the disclosure, and FIG. 1 may also be used to describe the method of fabricating the semiconductor device 500a. Please refer to FIG. 1, first of all, the semiconductor substrate 200 which has a first conductive type by doping dopants is provided. For example, when the first conductive type is P-type, the semiconductor substrate 200 may serve as a P-type substrate. In some embodiments, the dopant concentration of the semiconductor substrate 200 can be $1\times10^{11}/cm^3$-$1\times10^{15}/cm^3$ approximately. The term "lightly doped" indicates that the dopant concentration is less than about $1 \times 10^{15}/cm^3$. In some embodiments, the semiconductor substrate 200 may comprise a silicon substrate. In some other embodiments, a SiGe substrate, a bulk semiconductor substrate, a strained semiconductor substrate, a compound semiconductor substrate or another commonly used semiconductor substrate can be used as the semiconductor substrate 200.

As shown in FIG. 1, the substrate structure 300 includes a low side region 202, a high side region 208, and a level shift region 204 and an isolation region 206 disposed between the low side region 202 and the high side region 208. The isolation region 206 is located between the level shift region 204 and the high side region 208, so that the level-shift region 204 and the high side region 208 are separated from each other by the isolation region 206. In a cross-sectional view shown in FIG. 1, the low side region 202, the level shift region 204, the isolation region 206 and the high side region 208 are arranged in sequence from left to right in a direction parallel to a top surface 211 of the semiconductor substrate 200.

In some embodiments, the low side region 202 is provided for a low-voltage integrated circuit device, whose operational voltage can be lower than about 20V, for example, formed thereon. The high side region 208 is provided for a high-voltage integrated circuit device, the operational voltage of which can be, for example, higher than or equal to about 600V, formed thereon. In addition, the level-shift region 204 may include a lateral diffused metal-oxide-semiconductor (LDMOS) device 270 formed thereon. The low side region 202 and the high side region 208 of the LDMOS are electrically isolated from each other by the isolation region 206 while the LDMOS device is in the off-state.

The source S of the LDMOS device 270 in the level-shift region 204 may be electrically coupled to the low-voltage integrated circuit device in the low side region 202. In addition, the drain D of the LDMOS device 270 in the level-shift region 204 may be electrically coupled to the high-voltage integrated circuit device in the high side region 208 through metal interconnections (not shown) crossing the isolation region 206. When the LDMOS device is in the on-state, the LDMOS device 270 can transfer a low voltage level suitable for the low side region 202 to a high voltage level suitable for the high side region 208.

Please refer to FIG. 1, an implantation process may be performed (not shown), to implant dopants having a second conductive type, such as group VA dopant of phosphorus (P), arsenic (As), in portions of the semiconductor substrate 200, which are located at the high side region 208 by the side of the isolation region 206 and located between the isolation region 206 and the level shift region 204, to form a second conductive type buried doped layer 212. The second conductive type buried doped layer 212 has the second conductive type that is different from the first conductive type. For example, when the first conductive type is P-type, the second conductive type is N-type, and the second conductive type buried doped layer 212 may serve as an N-type buried (N-buried) doped layer. After performing the ion implanting process, an anneal process may be performed in order to activate dopant and make the dopant concentration of the second conductive type buried doped layer 212 distribute uniformly.

Next, an epitaxial growth process is performed in order to entirely form an epitaxial layer 220 on the top surface 211 of the semiconductor substrate 200. The epitaxial growth process may include, such as metal-organic chemical vapor deposition (MOCVD), metalorganic vapour phase epitaxy (MOVPE), plasma-enhanced chemical vapor deposition (plasma-enhanced CVD), remote plasma-enhanced enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE) or the like. In some embodiments, when the epitaxial growth process is performed, it may perform in-situ dopant in reactive gas adding phosphine or $AsH_3$ (arsine) to form the epitaxial layer 220. In some embodiments, an un-doped epitaxial layer (not shown) may be grown epitaxially first, and then the un-doped epitaxial layer is doped by phosphorous ion or arsenic ion to form the epitaxial layer 220.

The epitaxial layer 220 may be formed of silicon, germanium, silicon and germanium, III-V compound semiconductors or combinations thereof. The epitaxial layer 220 may have the second conductive type that is different from the first conductive type. For example, when the first conductive type is P-type, the second conductive type is N-type. Also, the epitaxial layer 220 may serve as an N-type epitaxial layer 220. In some embodiments, the epitaxial layer 220 may have a dopant such as phosphorus (P), and the thickness boundary of the epitaxial layer 220 may be 1 μm to 8 μm. After the processes described above, the semiconductor substrate 200 and the epitaxial layer 220 above the semiconductor substrate 200 may collectively serve as a substrate structure 300.

During the epitaxial growth process of the epitaxial layer 220, the second conductive type buried doped layer 212 diffuses and extends into the epitaxial layer 220. That is, after the epitaxial layer 220 is formed, a top surface of the second conductive type buried doped layer 212 may be located above the top surface 211 of the semiconductor substrate 200.

Next, as shown in FIG. 1, another implantation process may be performed to implant dopants in the epitaxial layer 220 in the low side region 202 and the level shift region 204, in order to form a high-voltage first conductive type well region 222 in the epitaxial layer 220 in the low side region 202 and the level shift region 204. For instance, when the first conductive type is P-type, the second conductive type is N-type. The high-voltage first conductive type well region 222 may serve as a high-voltage P-type well region (HVPW) 222. In some embodiments, a bottom surface of the high-voltage first conductive type well region 222 may be located in the epitaxial layer 220, or may be aligned with an interface 260, whose position is same as the position of the top surface 211 of the substrate 200, between the semiconductor substrate 200 and the epitaxial layer 220.

Next, as shown in FIG. 1, several implantation processes may be performed to implant different dopants in the epitaxial layer 220 in the low side region 202, the level shift region 204, the isolation region 206 and the high side region 208 separately, in order to form a first conductive type drift doped region 230 in the epitaxial layer 220 in the low side region 202, and form second conductive type drift doped regions 228 in the epitaxial layer 220 in the low side region 202, the level shift region 204 and the high side region 208. For example, when the first conductive type is P-type, the second conductive type is N-type, the first conductive type drift doped region 230 may serve as a P-type drift (P-drift) doped region 230, and the second conductive type drift doped regions 228 may serve as N-type drift (N-drift) doped regions 228.

Next, as shown in FIG. 1, one or multiple implantation process is performed to implant different dopants in the epitaxial layer 220 in the low side region 202 and the epitaxial layer 220 in the level shift region 204 separately, in order to form a first conductive type well region 226 on the P-type drift doped region 230. In addition, a second conductive type buffer doped region 227 is formed on the N-type drift doped region 228. For instance, when the first conductive type is P-type, the second conductive type is N-type, the first conductive type well region 226 may serve as a P-type well region 226, and the second conductive type buffer doped region 227 may serve as an N-type buffer doped region 227.

In some embodiments, the dopant concentration of the high-voltage first conductive type well region 222 is lower than the dopant concentration of the first conductive type drift doped region 230, and the dopant concentration of the first conductive type drift doped region 230 is lower than the dopant concentration of the first conductive type well region 226. The dopant concentration of the epitaxial layer 220 is lower than that of the second conductive type drift doped region 228, and the dopant concentration of the second conductive type drift doped region 228 is lower than that of the second conductive type buffer doped region 227.

Figure 3:
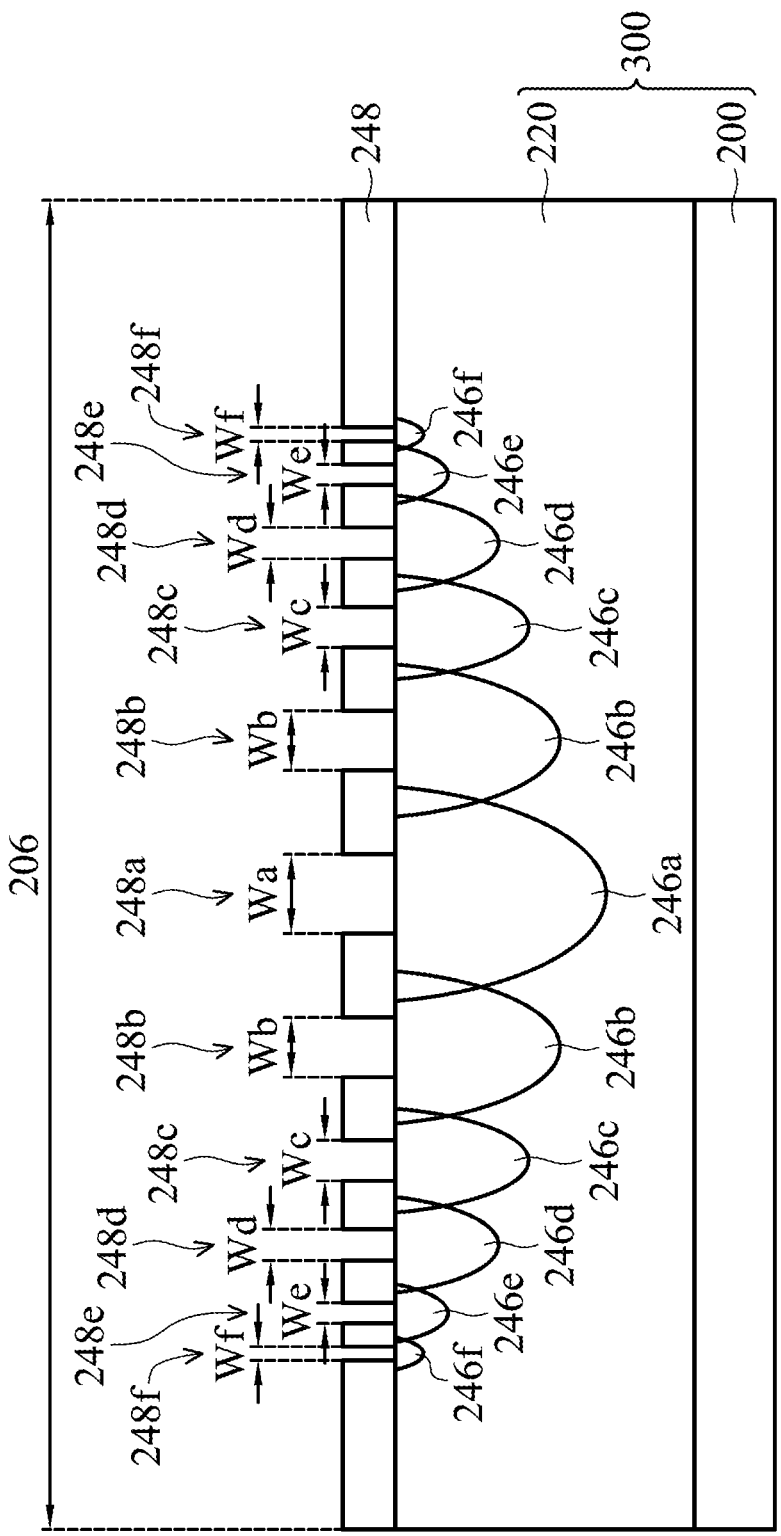
FIG. 3 is schematic cross-sectional view showing intermediate stages of a method for fabricating a doped isolation region in an isolation region in accordance with some embodiments of the disclosure.

Next, the method for fabricating the doped isolation region 246 in accordance with some embodiments of the disclosure is shown in FIGS. 1 and 3. FIG. 3 is enlarged view of the isolation region 206 of the semiconductor device shown in FIG. 1. Also, FIG. 3 illustrates intermediate stages of a method for fabricating the doped isolation region 246 in the isolation region 206. The method is performed before forming the isolation structures 240 shown in FIG. 1. Therefore, the isolation structures 240 are not shown in FIG. 3. For illustrative convenience, the second conductive type buried doped layer 212 is not shown.

As shown in FIG. 3, a photolithography process may be performed to form a mask pattern 248 on the top surface 221 of the epitaxial layer 220 in the isolation region 206. The mask pattern 248 may have a plurality of openings 248a-248f. Portions of the epitaxial layer 220 in the isolation region 206 are exposed to the openings 248a-248f of the mask pattern 248. Eleven openings are shown for clarity, but the number of openings of the mask pattern is not limited to the disclosed embodiments. In other embodiments, the number of openings of the mask pattern 248 is set to meet requirements. In some embodiments, as shown in FIG. 3, the opening 248a of the mask pattern 248 is located close to in a central region of the isolation region 206, and the openings 248a-248f are sequentially disposed from the central region of the isolation region 206 to a peripheral region of the isolation region 206, for example, which is located at the boundary between the isolation region 206 and the level shift region 204 and is located at the boundary between the isolation region 206 and the high side region 208 shown in FIG. 1. Also, the width Wa of the opening 248a, the width Wb of the of the opening 248b, the width Wc of the of the opening 248c, the width Wd of the of the opening 248d, the width We of the of the opening 248e and the width Wf of the of the opening 248f of the mask pattern 248 are designed to be decreased linearly and sequentially from the central region of the isolation region 206 to a peripheral region of the isolation region 206. In any two neighboring openings of the openings 248a-248f of the mask pattern 248, the width of the one close to the isolation region 206 is greater than that of the other one that is relatively away from the isolation region 206. For instance, for the two neighboring openings 248a and 248b of the mask pattern 248, the width Wa of the opening 248a, which is close to the isolation region 206 is greater than the width Wb of the opening 248b, which is away from the isolation region 206. The relationship of the widths between the other two neighboring openings of the mask pattern 248 may be similar to the widths of the openings 248a and 248b.

Next, please refer to FIG. 3. An implantation process is performed to use the mask pattern 248 as a mask. Therefore, a plurality of isolation doped sub-regions 246a-246f are formed in portions of the epitaxial layer 220 of the isolation region 206 exposed to the openings 248a-248f. Because the widths Wa-Wf of the openings 248a-248d of the mask pattern 248 are decreased linearly and sequentially from the central region close to the isolation region 206 to the peripheral region, at least one of the depths and the dopant concentrations of the isolation doped sub-regions 246a-246f are decreased linearly from a position which is close to the central region of the isolation region 206 to the peripheral region, for example, which is close to a boundary between the isolation region 206 and the level shift region 204 and a boundary between the isolation region 206 and the high side region 208, of the isolation region 206. In any two neighboring isolation doped sub-regions among the isolation doped sub-regions 246a-246f, at least one of the depth and the dopant concentration of the isolation doped sub-region that is close to the central region of the isolation region 206 is greater than at least one of the depth and dopant concentration of the other isolation doped sub-region that is relatively away from the isolation region 206. For instance, for the two neighboring isolation doped sub-regions 246a and 246b, at least one of the depth and the dopant concentration of the isolation doped sub-regions 246a close to the central region of the isolation region 206 may be greater than at least one of the depths and the dopant concentrations of isolation doped sub-regions 246b that are away from the isolation region 206. The relationship of the depths between the remaining two neighboring isolation doped sub-regions may be similar to the isolation doped sub-regions 246a and 246b. In some embodiments, two neighboring isolation doped sub-regions partially overlap each other. Next, the mask pattern 248 is removed.

Next, an annealing process is performed to cause the uniform diffusion of the dopants in the isolation doped sub-regions 246a-246d shown in FIG. 3. Therefore, the diffused isolation doped sub-regions 246a-246d form the doped isolation region 246 shown in FIG. 1. After the anneal process is performed, at least one of the depth and the dopant concentration of the doped isolation region 246 is decreased linearly from a position close to the central region of the isolation region 206 to the peripheral region away from the isolation region 206. In other words, at least one of the depth and the dopant concentration of the doped isolation region 246 are decreased linearly from the central region close to the doped isolation region 246 (approximately located in the isolation doped sub-region 246a shown in FIG. 3) to the peripheral region away from the doped isolation region (approximately located in the isolation doped sub-regions 246f shown in FIG. 3). Therefore, in a cross-sectional view shown in FIG. 1, the first width W1 of the doped isolation region 246 close to the top surface, whose position is equal to the top surface 221 of the epitaxial layer 220, of the substrate structure 300 is longer than the second width W2 of the doped isolation region 246 close to the bottom surface 213 of the substrate structure 300. Also, two opposite sidewalls of the doped isolation region 246, for example, the first sidewall 242a and the third sidewall 244a, have continuous and smooth profiles. Furthermore, the bottom surface 247 of the doped isolation region 246 is aligned with the bottom surface of the epitaxial layer 220 whose position is equal to the top surface 211 of the semiconductor substrate 200.

Please refer to FIG. 1 again, after forming the doped isolation region 246, a plurality of isolation structures 240 may be formed on the top surface 221 of the epitaxial layer 220. As shown in FIG. 1, the plurality of isolation structures 240 respectively cover portions of the top surface 221 of the semiconductor substrate 200 in the low side region 202, the level shift region 204, the isolation region 206 and the high side region 208, in order to define a plurality of active regions in the low side region 202, the level shift region 204, the isolation region 206 and the high side region 208. For example, the isolation structures 240 define the position of a pick-up doped region in the low side region 202, positions of a gate, a source doped region and a drain doped region of the LDMOS device in the level-shift region 204, and the position of a pick-up doped region in the high side region 208.

Then, as shown in FIG. 1, a gate structure 250 is formed on the top surface 221 of the epitaxial layer 220 in the level shift region 204. The gate structure 250 covers a portion of isolation structure 240 located on the high-voltage first conductive type well region 222 and the epitaxial layer 220, and covers the high-voltage first conductive type well region 222 and the second conductive type drift doped region 228, which is between the low side region 202 and the gate structure 250, above the high-voltage first conductivity type well region 222. The gate structure 250 is separated from another second conductive type drift doped region 228 by another one of the isolation structures 240, which is between the gate structure 250 and the high side region 208. The way of forming the gate structure 250 may include performing a thin film deposition process, such as chemical vapor deposition (CVD) or atomic layer deposition (ALD), to conformally form a gate insulation material (not shown) on the top surface 221 of the epitaxial layer 220. Next, another thin film deposition process, which includes physical vapor deposition (PVD), chemical vapor deposition (CVD), atomic layer deposition (ALD) or other method, is performed to entirely form a gate electric conductive material on the gate insulation material. Next, a patterning process is performed to remove a portion of gate electric conductive material and gate insulation material to form the gate structure 250.

Next, as shown in FIG. 1, several of implantation processes are performed, in order to implant different dopants in the epitaxial layer 220 in the low side region 202, the level shift region 204 and the high side region 208, to form the first conductive type doped connection wire regions (pick-up doped region) 234 on the first conductive type well region 226 in the epitaxial layer 220 of the low side region 202, and the second conductive type doped connection wire regions 236 respectively on the different second conductive type buffer doped regions 227 in the epitaxial layer 220 in the level shift region 204 and the high side region 208. For instance, when the first conductive type is P-type, the second conductive type is N-type, the first conductive type doped connection wire regions 234 may be regarded as P-type doped connection wire regions 234, and the second conductive type doped connection wire regions 236 may be regarded as N-type doped connection wire regions 236.

In some embodiments, the dopant concentration of the first conductive type doped connection wire region 234 is higher than the dopant concentration of the first conductive type well region 226. The dopant concentration of the second conductive type doped connection wire region 236 is higher than the dopant concentration of the second conductive type buffer doped region 227.

After the aforementioned processes, a laterally diffused MOS (LDMOS) device 270 is formed in the level shift region 204. The LDMOS device 270 has the gate structure 250, the source doped region and drain doped region. The second conductive type drift doped region 228, the second conductive type buffer doped region 227 and the second conductive type doped connection wire region 236 between the low side region 202 and the gate structure 250 serve as the source doped region of the LDMOS device 270. In addition, the second conductive type drift doped region 228, the second conductive type buffer doped region 227 and the second conductive type doped connection wire region 236 between the gate structure 250 and the high side region 208 serve as the drain doped region of the LDMOS device 270. In addition, after the aforementioned processes, the semiconductor device 500a in some embodiments of the disclosure may be completed.

In the embodiment shown in FIG. 1, the doped isolation region 246 of the semiconductor device 500a may include a first doped sub-region 242 and a second doped sub-region 244 adjacent to each other. The position of the first doped sub-region 242 is close to the level shift region 204, and the position of the second doped sub-region 244 is close to the high side region 208. As described above, at least one of the depth and the dopant concentration of the doped isolation region 246 is decreased linearly from a central region to a peripheral region close to the doped isolation region 246. In other words, at least one of the depth and the dopant concentration of the first doped sub-region 242 of the doped isolation region 246 is decreased linearly along a first direction 252 from the isolation region 206 to the level shift region 204. Therefore, a first side wall 242a of the first doped sub-region 242 close to the level shift region 204 is non-parallel with a second side wall 242b of the first doped sub-region 242 away from the level shift region 204. Similarly, at least one of the depth and the dopant concentration of the second doped sub-region 244 are decreased linearly along a second direction 254 from the isolation region 206 to the high side region 208. Therefore, a third side wall 244a of the second doped sub-region 244 close to the high side region 208 is non-parallel with a fourth side wall 244b of the second doped sub-region 244 away from the high side region 208.

In the embodiment shown in FIG. 1, a first angle θ1 is formed between the first side wall 242a of the first doped sub-region 242 of the doped isolation region 246 and a normal direction of a top surface of the substrate structure 300 whose position is equal to the top surface 221 of the epitaxial layer 220. In addition, a second angle θ2 is formed between the third side wall 244a of the second doped sub-region 244 of the doped isolation region 246 and a normal direction of the top surface of the substrate structure 300. The first angle θ1 and the second angle θ2 are less than 90 degrees. In other words, the first sidewall 242a of the first doped sub-region 242 and the third sidewall 244a of the second doped sub-region 244 of the doped isolation region 246 may serve as two opposite sidewalls of the doped isolation region 246. Two opposite sidewalls of the doped isolation region 246 have a continuous and smooth profiles and non-parallel with each other.

In the embodiment shown in FIG. 1, the second sidewall 242b of the first doped sub-region 242 of the doped isolation region 246 overlaps the fourth sidewall 244b of the second doped sub-region 244, and the second sidewall 242b and the fourth sidewall 244b are fabricated to locate on the central region of the doped isolation region 246. Therefore, a first distance A1 which is the distance between the second sidewall 242b of the first doped sub-region 242 (or the fourth side wall 244b of the second doped sub-region 244) and the level shift region 204 is equal to a second distance A2 which is the distance between the second side wall 242b (or the fourth side wall 244b of the second doped sub-region 244) and the high side region 208. The first doped sub-region 242 and the second doped sub-region 244 may be in mirror symmetry. In the embodiment shown in FIG. 1, the first included angle θ1 is equal to the second included angle θ2. Whereas, in some other embodiments of the disclosure, the first included angle θ1 is not equal to the second included angle θ2. A first bottom surface 242c of the first doped sub-region 242 is adjacent to a second bottom surface 244c of the second doped sub-region 244, and both of the first bottom surface 242c and the second bottom surface 244c are aligned with the bottom surface of the epitaxial layer 220 whose position is equal to the top surface 211 of the semiconductor substrate 200. In other embodiments of the disclosure, the first doped sub-region 242 and the second doped sub-region 244 of the doped isolation region 246 may not contact the top surface 211 of the semiconductor substrate 200.

Figure 2:
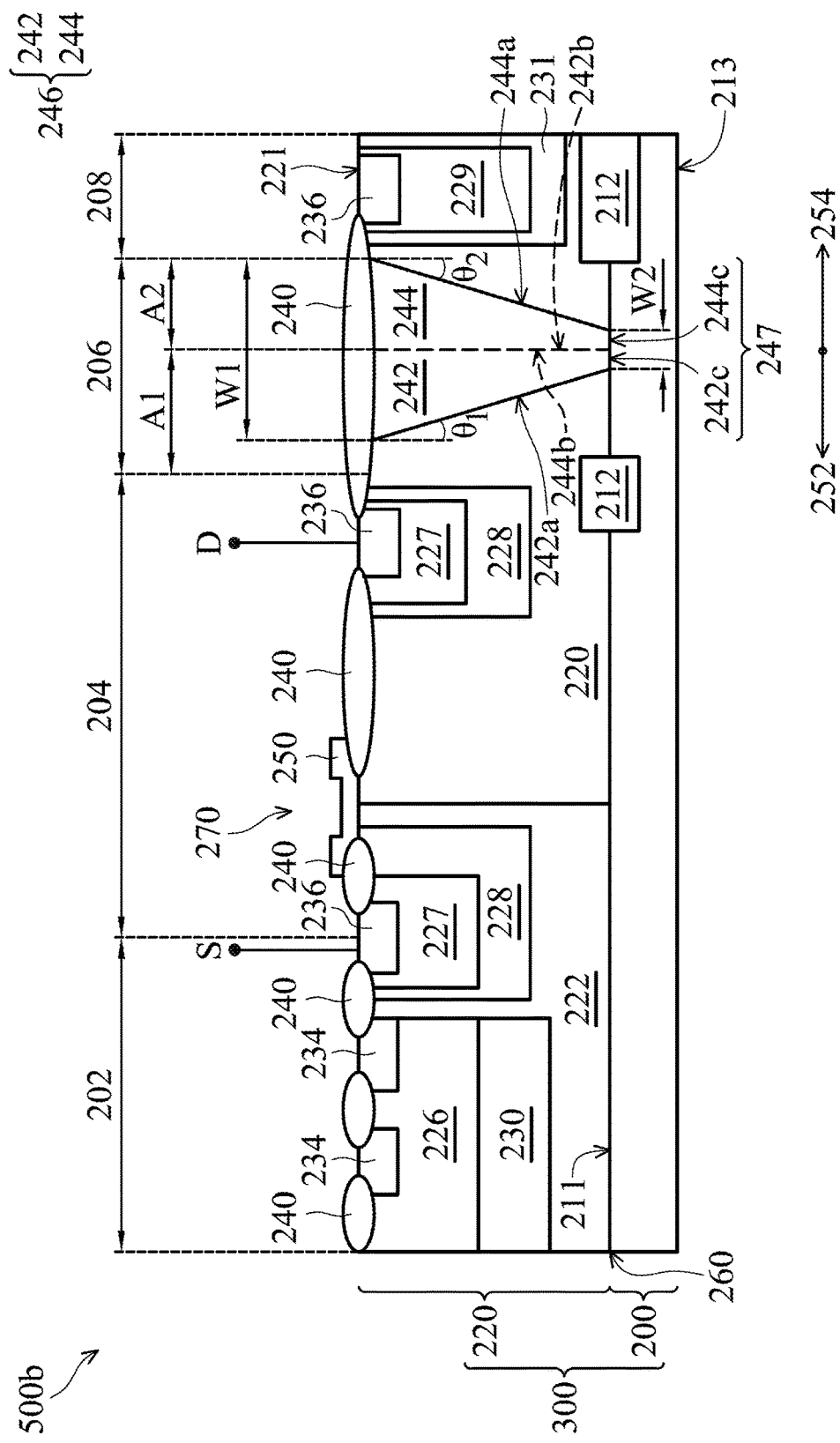

FIG. 2 is a schematic cross-sectional view showing the semiconductor device 500b in accordance with other embodiments of the disclosure. Elements of the embodiments hereinafter that are the same or similar as those previously described with reference to FIG. 2, are not repeated for brevity.

In other embodiments of the disclosure, the central region of the doped isolation region 246 may be fabricated to misalign with the central region of the isolation region 206. For this reason, the first distance A1 between the second side wall 242b of the first doped sub-region 242 (or the fourth side wall 244b of the second doped sub-region 244) of the semiconductor device 500b and the level shift region 204 is not equal to the second distance A2 between the second side wall 242b (or the fourth side wall 244b of the second doped sub-region 244) and high side region 208, as shown in FIG. 3.

As shown in FIG. 2, the doped region of the high side region 208 of the semiconductor device 500b may include the high-voltage second conductive type well region 231, the second conductive type drift doped region 229 and the second conductive type doped connection wire region 236, which are arranged sequentially from bottom to top, disposed in epitaxial layer 220. For example, when the first conductive type is P-type, the second conductive type is N-type. Also, the high-voltage second conductive type well region 231 may serve as a high-voltage N-type well (HVNW region) 231, the second conductive type drift doped region 229 may serve as a N-type well/N-type drift doped region (NW/N-drift doped region) 229, and the second conductive type doped connection wire region 236 may be regarded as N-type doped connection wire region 236.

In some embodiments, the dopant concentration of the epitaxial layer 220 is less than the dopant concentration of the high-voltage second conductive type well region 231, the dopant concentration of the high-voltage second conductive type well region 231 is less than the second conductive type drift doped region 229, and the dopant concentration of the second conductive type drift doped region 229 is less than the dopant concentration of second conductive type doped connection wire region 236. In some embodiments, the second conductive type drift doped region 228 and the second conductive type drift doped region 229 may be formed in the same step, or in different steps.

The semiconductor device of the disclosure is provided to one kind of high-voltage semiconductor device of the high-voltage IC. A doped isolation region is disposed in the substrate structure (the epitaxial layer) of the isolation region which is configured to electrically isolate the high side region and the low side region of the semiconductor device. At least one of the depth and the dopant concentration of the doped isolation region is decreased linearly from a position close to a central region of the doped isolation region to another position close to a peripheral region of the doped isolation region, which may help fully deplete the doped isolation region, so that the doped isolation region is in the charge balance condition. In addition, the design of the doped isolation region may help to uniformly distribute the surface field of the high-voltage semiconductor, so that the high breakdown voltage (BVD) of the high-voltage integrated circuit is improved. In addition, the doped isolation region is designed to have the width close to the top surface of the substrate structure greater than the width thereof close to the bottom surface of the substrate structure. Therefore, the doped isolation region can increase the effective width between the high side region and the low side region while satisfying the requirements of the improved BVD, so that the dopant concentration of the doped isolation region is high enough to suppress the lateral punch-through leakage current.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate structure, comprising a semiconductor substrate having a first conductive type, wherein the substrate structure comprises:
     a high side region;
     a low side region separated from the high side region; and
     a level shift region and an isolation region disposed between the high side region and the low side region, wherein the level-shift region and the high side region are separated from each other by the isolation region;
   an epitaxial layer disposed on the semiconductor substrate, wherein the epitaxial layer has a second conductive type different from the first conductive type; and
   a doped isolation region having the first conductive type and located in the isolation region, wherein the doped isolation region comprises:
     a first doped sub-region having a depth decreased linearly along a first direction from the isolation region to the level shift region, wherein the first doped sub-region has a width decreased linearly from a top surface of the epitaxial layer to a bottom surface of the epitaxial layer; and
     a second doped sub-region disposed adjacent to the first doped sub-region, wherein the second doped sub-region has a depth decreased linearly along a second direction from the isolation region to the high side region, and wherein the second doped sub-region has a width decreased linearly from the top surface of the epitaxial layer to the bottom surface of the epitaxial layer, wherein a side wall of the first doped sub-region overlaps a side wall of the second doped sub-region, and wherein in a cross-sectional view, the first doped sub-region and the second doped sub-region are in mirror symmetry with respect to the side wall of the first doped sub-region or the side wall of the second doped sub-region.

2. The semiconductor device as claimed in claim 1, wherein the first doped sub-region has a first dopant concentration which is decreased linearly along the first direction.

3. The semiconductor device as claimed in claim 1, wherein the second doped sub-region has a second dopant concentration which is decreased linearly along the second direction.

4. The semiconductor device as claimed in claim 1, wherein a first bottom surface of the first doped sub-region is adjacent to a second bottom surface of the second doped sub-region.

5. The semiconductor device as claimed in claim 1, wherein the doped isolation region is located in the epitaxial layer.

6. The semiconductor device as claimed in claim 1, wherein a bottom surface of the doped isolation region is aligned with a bottom surface of the epitaxial layer.

7. The semiconductor device as claimed in claim 1, wherein a first side wall of the first doped sub-region which is close to the level shift region, is non-parallel with a second side wall of the first doped sub-region which is away from the level shift region.

8. The semiconductor device as claimed in claim 7, wherein a third side wall of the second doped sub-region which is close to the high side region is non-parallel with a fourth side wall of the second doped sub-region which is away from the high side region.

9. A semiconductor device, comprising:
a substrate structure, comprising a semiconductor substrate having a first conductive type, wherein the substrate structure comprises:
  a high side region;
  a low side region separated from the high side region; and
  a level shift region and an isolation region disposed between the high side region and the low side region, wherein the level shift region and the high side region are separated from each other by the isolation region;
an epitaxial layer disposed on the semiconductor substrate, wherein the epitaxial layer has a second conductive type different from the first conductive type; and
a doped isolation region having the first conductive type and located in the isolation region, wherein the doped isolation region has a depth decreased linearly from a central region thereof to a peripheral region thereof, and wherein the doped isolation region has a width decreased linearly from a top surface of the epitaxial layer to a bottom surface of the epitaxial layer,
wherein a first side wall and a second side wall of the doped isolation region near a top surface of the substrate structure are non-parallel with each other.

10. The semiconductor device as claimed in claim 9, wherein the doped isolation region has a dopant concentration decreased linearly from about the central region thereof to the peripheral region thereof.

11. The semiconductor device as claimed in claim 9, wherein the peripheral region of the doped isolation region is close to the level shift region and/or the high side region.

12. The semiconductor device as claimed in claim 9, wherein the central region of the doped isolation region does not overlap a central region of the isolation region.

13. A semiconductor device, comprising:
a substrate structure, comprising a semiconductor substrate having a first conductive type, wherein the substrate structure comprises:
  a high side region;
  a low side region separated from the high side region; and
  a level shift region and an isolation region disposed between the high side region and the low side region, wherein the level shift region and the high side region are separated from each other by the isolation region;
an epitaxial layer disposed on the semiconductor substrate, wherein the epitaxial layer has a second conductive type different from the first conductive type; and
a doped isolation region, having the first conductive type and located in the isolation region, and the doped isolation region extended from a top surface of the substrate structure to a portion of the substrate structure, wherein the doped isolation region has a width decreased linearly from a top surface of the epitaxial layer to a bottom surface of the epitaxial layer, and wherein a first width of the doped isolation region close to the top surface of the substrate structure is greater than a second width of the doped isolation region close to the bottom surface of the substrate structure in a cross-sectional view,
wherein a first side wall and a second side wall of the doped isolation region near the top surface of the substrate structure are non-parallel with each other.

14. The semiconductor device as claimed in claim 13, wherein a first angle between the first side wall and a normal direction of the top surface of the substrate structure is less than 90 degrees.

15. The semiconductor device as claimed in claim 14, wherein a second angle formed by the second side wall and the normal direction is smaller than 90 degrees.

16. The semiconductor device as claimed in claim 15, wherein the first angle is not equal to the second angle.

17. The semiconductor device as claimed in claim 13, wherein the doped isolation region has a depth decreased linearly from a central region thereof to a peripheral region thereof.

* * * * *